(12) United States Patent
Yamanaka

(10) Patent No.: US 9,949,384 B2
(45) Date of Patent: Apr. 17, 2018

(54) ELECTRONIC DEVICE

(71) Applicant: DENSO CORPORATION, Kariya, Aichi-pref. (JP)

(72) Inventor: Takahiro Yamanaka, Kariya (JP)

(73) Assignee: DENSO CORPORATION, Kariya, Aichi-pref. (JP)

(*) Notice: Subject to any disclaimer, the term of this patent is extended or adjusted under 35 U.S.C. 154(b) by 427 days.

(21) Appl. No.: 14/811,600

(22) Filed: Jul. 28, 2015

(65) Prior Publication Data

US 2016/0037659 A1 Feb. 4, 2016

(30) Foreign Application Priority Data

Jul. 31, 2014 (JP) ................. 2014-156482

(51) Int. Cl.
| | |
|---|---|
| H02K 11/00 | (2016.01) |
| H05K 5/00 | (2006.01) |
| H02K 11/30 | (2016.01) |
| H05K 7/20 | (2006.01) |
| H02K 11/33 | (2016.01) |
| H02K 9/22 | (2006.01) |

(52) U.S. Cl.
CPC ....... *H05K 5/0026* (2013.01); *H02K 11/0073* (2013.01); *H02K 11/30* (2016.01); *H02K 11/33* (2016.01); *H05K 7/2039* (2013.01); *H05K 7/20454* (2013.01); *H02K 9/22* (2013.01); *H02K 2213/03* (2013.01)

(58) Field of Classification Search
CPC .. H05K 5/002; H05K 7/2039; H05K 7/20454; H02K 2213/03; H02K 11/20–11/215
See application file for complete search history.

(56) References Cited

U.S. PATENT DOCUMENTS

| | | |
|---|---|---|
| 2005/0253457 A1 | 11/2005 | Pierret et al. |
| 2006/0150751 A1 | 7/2006 | Stolze |
| 2007/0257568 A1 | 11/2007 | Akita et al. |
| 2011/0031851 A1 | 2/2011 | Uryu et al. |

FOREIGN PATENT DOCUMENTS

| | | |
|---|---|---|
| JP | 2005-340698 A | 5/2004 |
| JP | 2012-253221 A | 12/2012 |
| JP | 2013-251991 A | 12/2013 |

*Primary Examiner* — Ramon M Barrera
(74) *Attorney, Agent, or Firm* — Knobbe, Martens, Olson & Bear, LLP

(57) ABSTRACT

An ECU includes a substrate and a chassis. Electronic components are mounted on a first primary surface of the substrate. The chassis includes a protruding portion that protrudes toward a position different from where the electronic components are. A height of the protruding portion is greater than a height of the electronic components, and shorter than a gap between the substrate and the heat sink. When warping occurs in the substrate and the first primary surface approaches an opposing surface of the heat sink, the protruding portion contacts the first primary surface. Accordingly, the electronic components are prevented from contacting the heat sink. Further, other electronic components may be mounted on an entire area of a second primary surface of the substrate.

7 Claims, 6 Drawing Sheets

ELECTRONIC DEVICE

CROSS REFERENCE TO RELATED APPLICATION

The present application is based on Japanese Patent Application No. 2014-156482 filed on Jul. 31, 2014, disclosure of which is incorporated herein by reference.

TECHNICAL FIELD

The present disclosure relates to an electronic device having a chassis and a substrate, the substrate having electronic components mounted thereon.

BACKGROUND

Conventionally, in order to ensure a clearance between a substrate having electronic components mounted thereon and a chassis, a well-known technique is to use screws to fix the substrate to the chassis not only at corner portions of the substrate, but also at a central portion of the substrate (see, for example, JP 2013-251991A). According to this conventional technique, the electronic components are prevented from contacting the chassis when warping occurs in the substrate.

SUMMARY

However, in the conventional technique exemplified by JP 2013-251991A, for both primary surfaces of the substrate, a screw is inserted through the central portion thereof. Accordingly, electronic components cannot be placed at these locations, and there is a concern that it may be difficult to miniaturize such an electronic device.

In view of the above points, an object of the present disclosure is to provide an electronic device that may be miniaturized, while at the same time preventing electronic components from contacting a chassis.

An electronic device according to the present disclosure includes a substrate having a primary surface on which electronic components are mounted and a chassis including an opposing surface, a support, and a protruding portion. Here, the opposing surface is arranged with a gap being defined, along a gap direction, between the primary surface of the substrate and the opposing surface, the support is configured to support the substrate, and the protruding portion is arranged to protrude from the opposing surface toward a position on the primary surface of the substrate, the position being different from where the electronic components are mounted. Further, the protruding portion is arranged inward, along the opposing surface, of the support. Here, in the gap direction of the gap between the primary surface of the substrate and the opposing surface of the chassis, a height of the protruding portion is greater than a height of the electronic components and shorter than the gap.

In the above described configuration, the gap is interposed between the primary surface of the substrate and the opposing surface of the chassis, which face each other. Along this gap direction, the electronic components and the protruding portion have heights. Since the height of the protruding portion is greater than the height of the electronic components, even if warping occurs in the substrate and the primary surface of the substrate approaches the opposing surface of the chassis, the primary surface of the substrate will contact the protruding portion of the chassis. Then, the primary surface of the substrate will not further approach the opposing surface of the chassis. Accordingly, the gap may be maintained between the electronic components and the opposing surface of the chassis, and the electronic components will not contact the opposing surface of the chassis.

As a result of the above described configuration, the electronic components may be mounted anywhere on the primary surface of the substrate except for the region facing the protruding portion, and may be mounted on the entire area of the other primary surface on the opposite side of the primary surface. In other words, when compared to conventional techniques, mounting surface area for the electronic components is increased. Accordingly, the electronic device may be miniaturized, while at the same time preventing the electronic components from contacting the chassis.

BRIEF DESCRIPTION OF THE DRAWINGS

The disclosure, together with additional objectives, features and advantages thereof, will be best understood from the following description, the appended claims and the accompanying drawings, in which:

DETAILED DESCRIPTION

Figure 1:
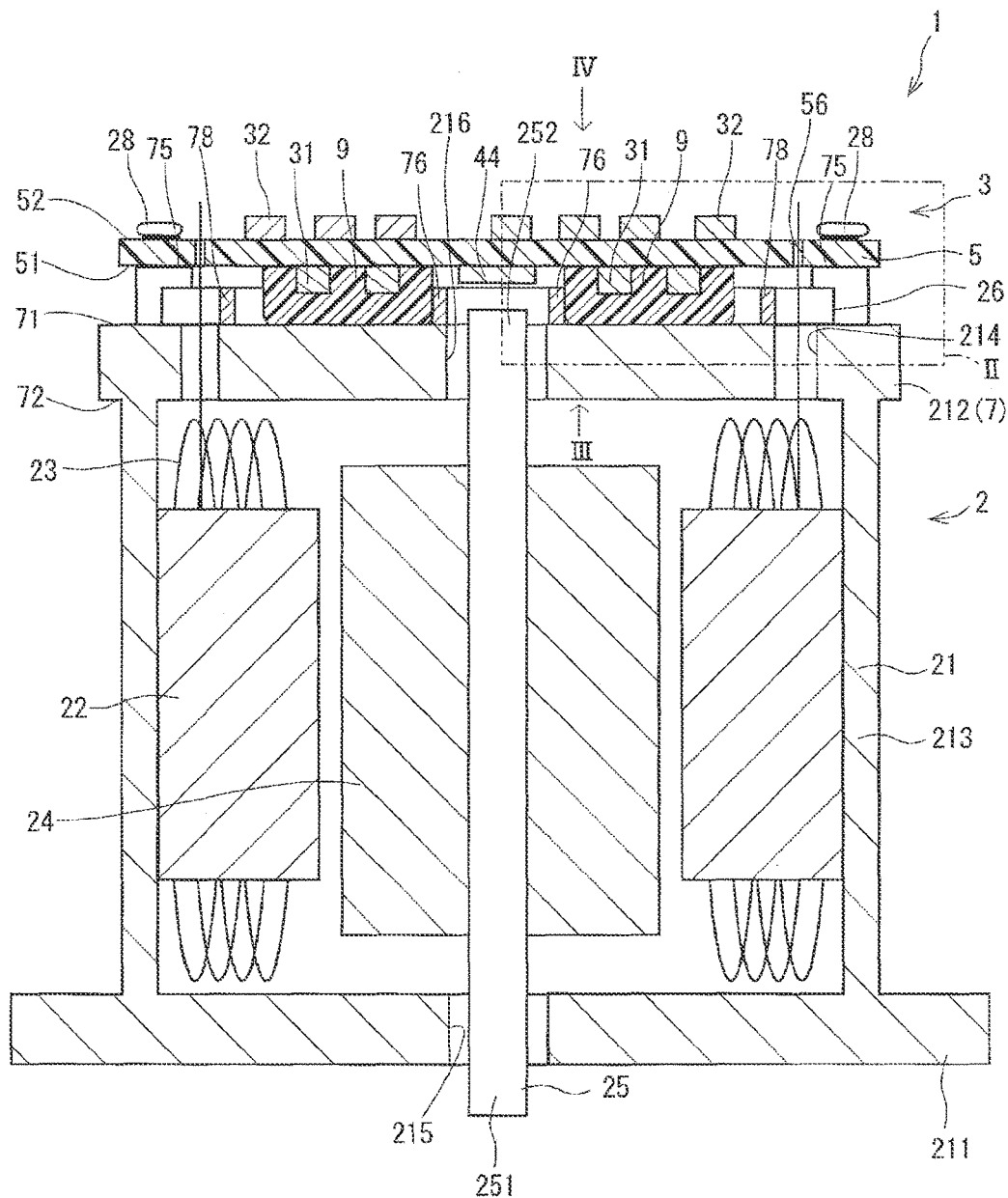
FIG. 1 is a cross-section view showing a schematic of drive device according to one embodiment of the present disclosure.

Hereinafter, one embodiment of the present disclosure will be explained with reference to the figures.

An electronic device according to the present embodiment is used in a drive device. Hereinafter, a drive device 1 will be explained with reference to FIGS. 1 to 4. The drive device 1 may be used in, for example, an electric power steering unit. In this case, the drive device 1 outputs steering assist torque, which is transmitted via a reduction gear to a steering column or a steering rack.

Configuration of Drive Device

First, a summary of the configuration of the drive device 1 will be explained with reference to FIG. 1. The drive device 1 includes a motor 2 and an ECU 3. The motor 2 acts as an electrical rotating machine, and the ECU 3 acts as an electronic device that controls energizing of the motor 2. Here, the ECU 3 is disposed on one side in an axial direction of the motor 2. Further, the motor 2 and the ECU 3 are integrally formed. Hereinafter, where appropriate, the axial direction of the motor 2 will be referred to as "the axial direction", and a radial direction of the motor 2 will be referred to as "the radial direction".

The motor 2 may be, for example, a three-phase brushless motor, and includes a motor casing 21, a stator 22, a winding assembly 23, a rotor 24, and a shaft 25. The motor casing 21 includes two bottom portions 211, 212 and a cylinder portion 213. The motor casing 21 has a close-ended cylindrical shape, and is formed from a metal such as aluminum. The stator 22 is fixed to an inner side of the motor casing 21. Two sets of the winding assembly 23 in three-phase connection are wound around the stator 22. A motor wire 26 extends from the winding assembly 23 for each phase. Further, motor wire insertion holes 214 are formed in the bottom portion 212 of the motor casing 21. The motor wires 26 are inserted through the motor wire insertion holes 214 and exit on the side of the ECU 3. The rotor 24 is disposed inside of the stator 22 in the radial direction, such that the rotor 24 is coaxial with the stator 22.

The shaft 25 is secured at an axial center of the rotor 24. Further, the shaft 25 is rotatably supported by bearings (not illustrated) provided in the motor casing 21. One end 251 of the shaft 25 is inserted through a shaft hole 215 formed in the bottom portion 211 which is on one side of the motor casing 21, and the one end 251 of the shaft 25 extends out of the motor casing 21. An output end (not illustrated) is formed at the one end 251 of the shaft 25. The other end 252 of the shaft 25 is inserted through a shaft hole 216 formed in the bottom portion 212, the bottom portion 212 being on the other side of the motor casing 21. Here, the other end 252 of the shaft 25 is exposed on the side of the ECU 3. A magnet (not illustrated) is retained on the other end 252 of the shaft 25.

Configuration of ECU

Next, the detailed configuration of the ECU 3 will be further explained with reference to FIGS. 2 to 4.

The ECU 3 includes a substrate 5, a heat sink 7, and a heat dissipating gel 9. The substrate 5 has electronic components 31, 32 mounted thereon. Further, the heat sink 7 acts as a chassis, and the heat dissipating gel 9 acts as a heat conducting material. In the present embodiment, the heat sink 7 is configured as the bottom portion 212 of the motor casing 21. In the follow explanations, where appropriate, the bottom portion 212 of the motor casing 21 will be referred to as the heat sink 7.

The substrate 5 is fixed by screws 28 to the bottom portion 212, and is positioned so as to be perpendicular with respect to the axial direction of the motor 2 and to face the bottom portion 212. In addition, motor wire insertion portions 56 are formed in the substrate 5. The motor wires 26 are inserted through the motor wire insertion portions 56 to be electrically connected to the substrate 5. Further, a rotation angle sensor 44 is mounted on the substrate 5. The rotation angle sensor 44 faces the magnet retained on the other end 252 of the shaft 25.

The substrate 5 may be, for example, a printed circuit board. Further, the substrate 5 has two primary surfaces, including a first primary surface 51 that faces the heat sink 7, and a second primary surface 52 on the opposite side of the first primary surface 51. In addition, wiring 59 is formed on the substrate 5 to electrically connect the motor wires 26 or an electric power terminal (not illustrated) with the electronic components 31, 32. When formed on the first primary surface 51, the wiring 59 is patterned so as to be positioned outside of the areas facing protruding portions 76-78. Further, in FIG. 3, only a portion of the wiring 59 formed on the first primary surface 51 of the substrate 5 is shown, and other wiring is omitted from the figure for simplicity. Here, the wiring 59 is for electrically connecting the electronic components 1, 32 to an external connection.

The electronic components 31 may be, for example, MOSFETs, and form two sets of inverters that correspond to each of the two sets of the winding assembly 23. Further, the electronic components 32 include capacitors, resistors, and the like. The electronic components 31 are disposed on the first primary surface 51 of the substrate 5, and the electronic components 32 are disposed on the second primary surface 52 of the substrate 5. Here, the electronic components 31 have a height H1 in the axial direction.

The heat sink 7 is formed from a heat conducting metal such as aluminum. Here, the surface of the heat sink 7 that faces the first primary surface 51 of the substrate 5 is referred to as an opposing surface 71. The surface of the heat sink 7 on the opposite side of the opposing surface 71 is referred to as a rear surface 72. A gap D1 is defined between the opposing surface 71 of the heat sink 7 and the first primary surface 51 of the substrate 5. Further, a gap D2 is defined between the opposing surface 71 of the heat sink 7 and the electronic components 31. In the present embodiment, a gap direction, in which the gaps D1 and D2 are defined, is substantially the same as the axial direction.

Substrate supports 75 (which may be collectively or individually referred to as "a support") are formed on the opposing surface 71 of the heat sink 7. The substrate supports 75 project toward the substrate 5 and support the substrate 5. Further, the substrate supports 75 are fixed to the substrate 5 by the screws 28. The gap D1, which is the space between the primary surface 51 of the substrate 5 and the opposing surface 71 of the heat sink 7, is equal to a height H2 of the substrate supports 75 as measured from the opposing surface 71.

The heat dissipating gel 9, which acts as a heat conducting material, fills space between the first primary surface 51 of the substrate 5 and the opposing surface 71 of the heat sink 7. Here, the heat dissipating gel 9 is in contact with the electronic components 31. The heat dissipating gel 9 is mainly composed of a heat conducting material such as silicone, and allows heat generated by the electronic components 31 to be transmitted to the heat sink 7. Further, the heat dissipating gel 9 has a high electrical resistance, and thus is roughly an electrical insulator.

The heat dissipating gel 9 does not fill the entire space between the substrate 5 and the heat sink 7. Instead, the heat dissipating gel 9 fills a predetermined range to the extent that the heat dissipating gel 9 can contact the electronic components 31. Hereinafter, an application range 54 refers to the range of application of the heat dissipating gel 9 on the first primary surface 51 of the substrate 5. Further, an application range 74 refers to the range of application of the heat dissipating gel 9 on the opposing surface 71 of the heat sink 7. In the present embodiment, the substrate 5 has two of the application range 54, and each application range 54 includes therein a number of the electronic components 31 (in the present embodiment, six) for each inverter.

Here, the protruding portions 76-78 (which may be collectively or individually referred to as "a protruding portion") are formed on the opposing surface 71 of the heat sink 7, and protrude toward the substrate 5. The protruding portions 76-78 are disposed inward of the substrate supports 75 in the radial direction, and are positioned closer toward the central portion of the substrate 5 than the substrate supports 75 are. In other words, the protruding portions 76-78 are arranged inward, along the opposing surface 71, of the substrate supports 75. Further, the protruding portions 76-78 protrude toward positions different from where the electronic components 31 are mounted on the first primary surface 51 of the substrate 5.

Figure 2:
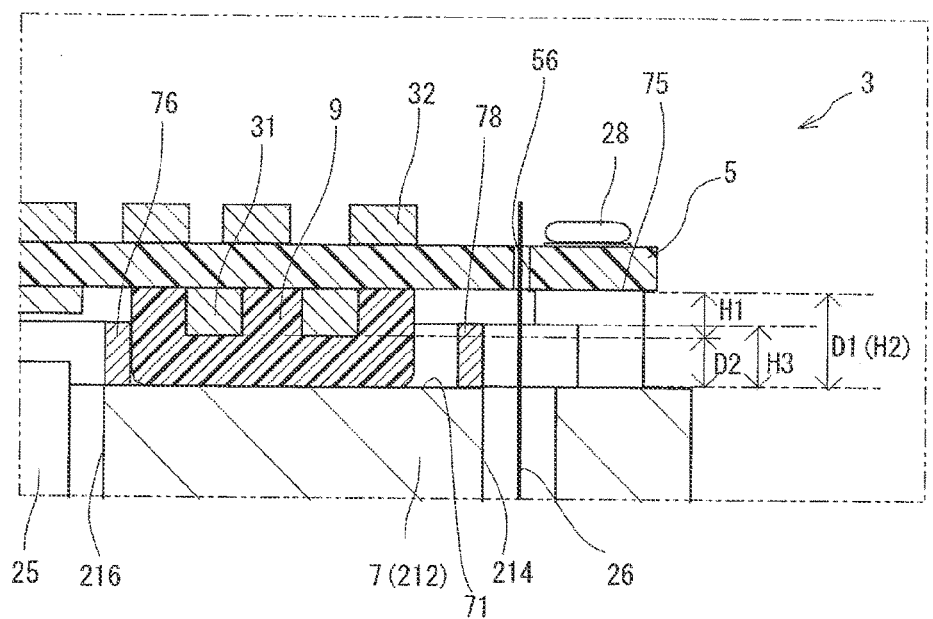
FIG. 2 is an expanded view showing portion II of FIG. 1.

As shown in FIG. 2, if the height of the protruding portions 76-78 in the axial direction is defined as H3, then the height H3 of the protruding portions 76-78 is greater than the height H1 of the electronic components 31. Further, the height H3 of the protruding portions 76-78 is shorter than the gap D1 between the opposing surface 71 of the heat sink 7 and the first primary surface 51 of the substrate 5. In addition, the height H3 of the protruding portions 76-78 is also longer than the gap D2 between the opposing surface 71 of the heat sink 7 and the electronic components 31. Accordingly, the protruding portions 76-78 are disposed to partially overlap, in the radial direction, with the electronic components 31.

Figure 3:
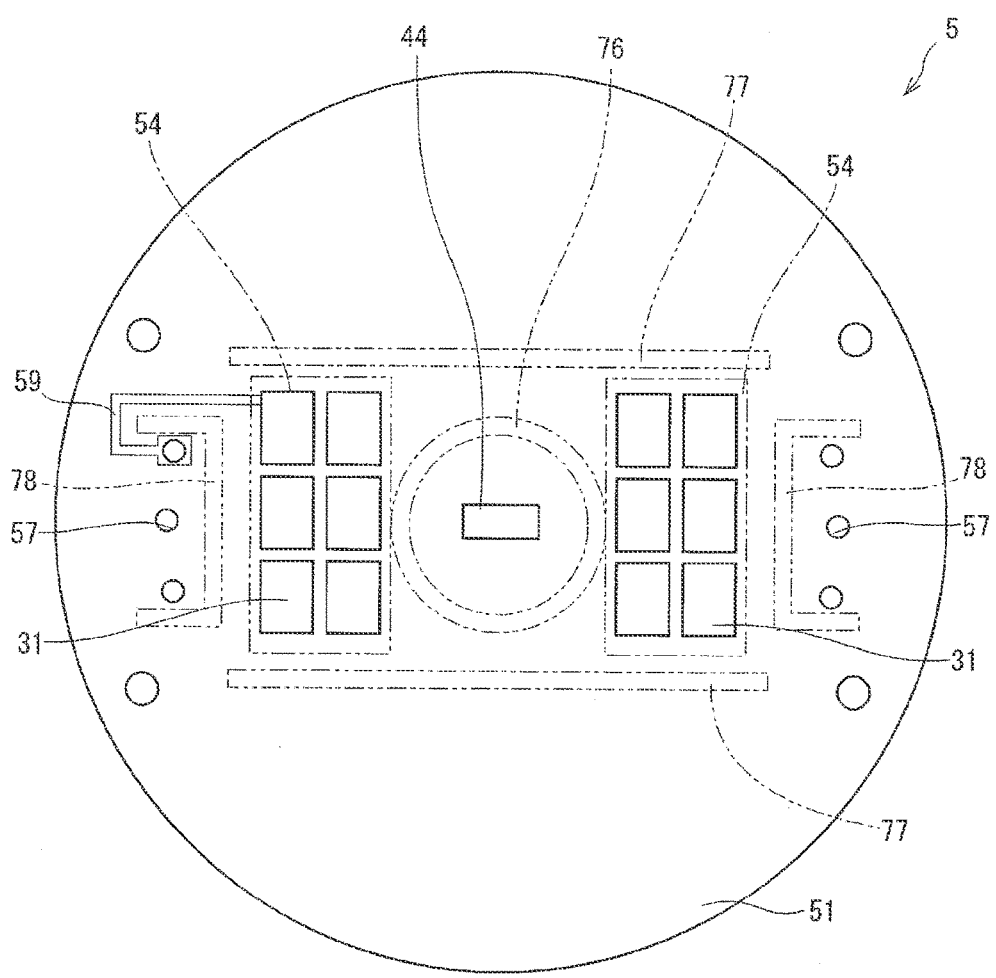
FIG. 3 is a plane view showing a substrate when viewed from direction III of FIG. 1.
Figure 4:
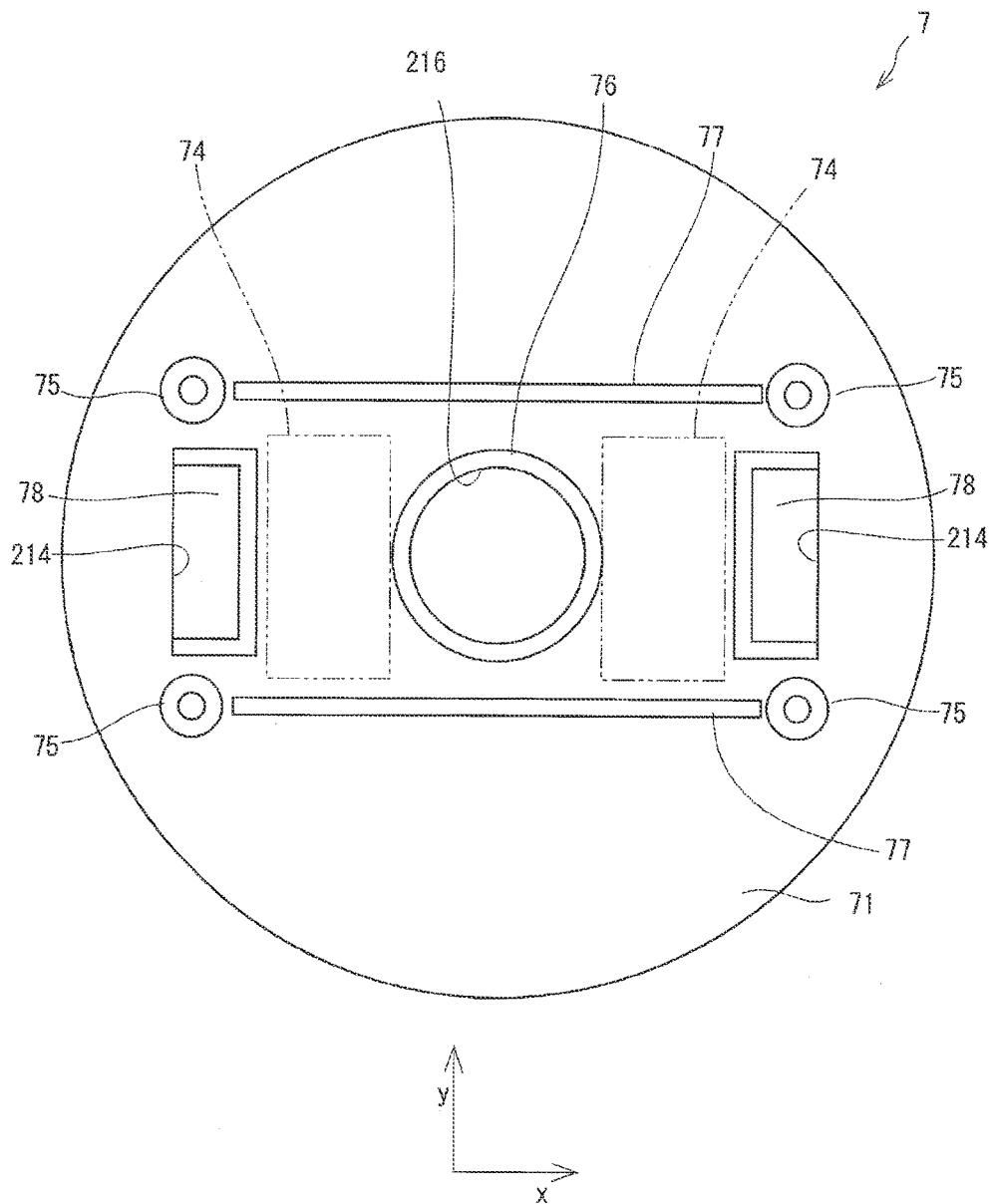
FIG. 4 is a plane view showing a heat sink when viewed from direction IV of FIG. 1.

As shown in FIGS. 3 and 4, the protruding portions 76-78 are disposed at respective different locations on the opposing surface 71 of the heat sink 7. Further, in FIG. 3, the regions of the first primary surface 51 of the substrate 5 which face the protruding portions 76-78 are shown with two-point dashed lines, and are denoted with the same reference numbers as the protruding portions 76-78. Specifically, the protruding portion 76, which acts as a shaft hole protruding portion, is positioned to face the central portion of the first primary surface 51 of the substrate 5. Here, the protruding portion 76 is arranged in a ring shape along the edge of the shaft hole 216 through which the shaft 25 is inserted. Further, the protruding portion 76 is provided near the boundary of the application range 74 and contacts the heat dissipating gel 9.

The protruding portion 77 is arranged as two linear shapes with the application range 74 interposed therebetween. Further, the protruding portion 78 is arranged to surround the motor wire insertion holes 214 of the heat sink 7, except with the side opposite from the application range 74 being open, to form a U-shape. In addition, the application range 74 is interposed between the protruding portion 78 and the protruding portion 76. Here, the protruding portions 76 and 78 surround the application range 74 along a direction (in FIG. 4, the x direction) that is orthogonal to a direction along which the protruding portion 77 surrounds in the application range 74 (in FIG. 4, the y direction). In other words, the protruding portions 76-78 are multiply arranged such that the heat dissipating gel 9 is interposed therebetween.

Effects

Figure 5:
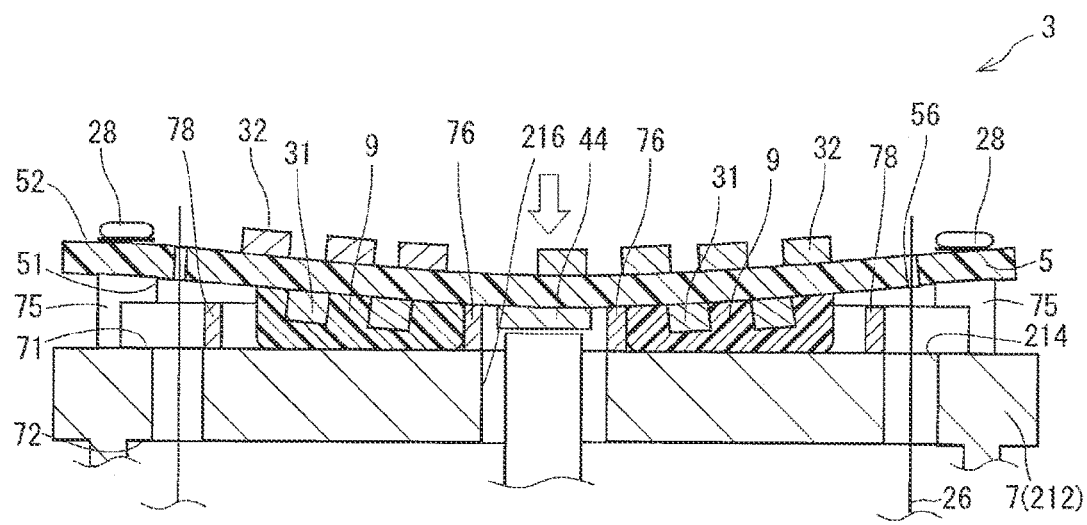
FIG. 5 is a schematic view showing the substrate in a warped state.

Due to temperature changes, warping may occur in the substrate 5. As shown in FIG. 5, when the substrate 5 is warped toward the heat sink 7, the first primary surface 51 of the substrate 5 approaches the opposing surface 71 of the heat sink 7. In the present embodiment, among all the areas of the primary surface 51 of the substrate 5, the central portion becomes the closest to the opposing surface 71 of the heat sink 7. Further, among all the areas of the primary surface 51 of the substrate 5, the central portion is inward of the areas supported by the substrate supports 75. Here, the central portion of the first primary surface 51 of the substrate 5 faces the protruding portions 76-78. Moreover, the height H3 of the protruding portion 76 is greater than the height H1 of the electronic components 31. Accordingly, the protruding portions 76-78 maintain a gap between the electronic components 31 and the heat sink 7.

In particular, in the present embodiment, among the protruding portions 76-78, the protruding portion 76 faces the central-most portion of the substrate 5. In this case, the protruding portion 76 contacts the first primary surface 51 of the substrate 5. As a result, the first primary surface 51 of the substrate 5 does not further approach the opposing surface 71 of the heat sink 7. Therefore, the electronic components 31 are prevented from contacting the opposing surface 71 of the heat sink 7.

In the present embodiment, as shown in FIG. 1, the electronic components 31, 32 may be mounted anywhere on the first primary surface 51 of the substrate 5 except for the regions facing the protruding portions 76-78, and be mounted on the entire area of the second primary surface 52 of the substrate 5. Accordingly, when compared to the conventional technique where screws are used to secure the central portion of the substrate 5, mounting surface area for the electronic components 31, 32 may be increased with respect to the substrate 5. Thus, in the present embodiment, the ECU 3 may be miniaturized, while at the same time preventing the electronic components 31 from contacting the heat sink 7.

Further, if the drive device 1 is used in an electric power steering unit, there is limited mounting space for positioning the drive device 1. Here, the miniaturization of the ECU 3 is advantageous by contributing to miniaturization of the entire drive device 1.

Further, in the present embodiment, wiring 59 of the substrate 5 is disposed on regions other than those facing the protruding portions 76-78. For this reason, even if the protruding portions 76-78 contact the substrate 5, problems such as disconnections or short circuits do not occur.

In addition, in the present embodiment, the heat dissipating gel 9 fills space between the first primary surface 51 of the substrate 5 and the opposing surface 71 of the heat sink 7. Accordingly, the protruding portions 76-78 further provide a function of preventing the heat dissipating gel 9 from moving. That is, at the locations where the protruding portions 76-78 are formed, a narrow gap is defined between the substrate 5 and the heat sink 7. Accordingly, it is difficult for the heat dissipating gel 9 to move and escape over the protruding portions 76-78.

In particular, in the present embodiment, the protruding portions 76-78 and the electronic components 31 are positioned so as to overlap in the radial direction. Accordingly, with regard to the heat dissipating gel 9, the protruding portions 76-78 and the electronic components 31 exist at same locations in the radial direction, and movement of the heat dissipating gel 9 may be further suppressed.

In the present embodiment, the heat sink 7 includes the shaft hole 216, through which the shaft 25 is inserted, and the motor wire insertion holes 214, through which the motor wires 26 are inserted. The protruding portion 76 encloses the shaft hole 216, through which the shaft 25 is inserted. Accordingly, the heat dissipating gel 9 is suppressed from dropping down into the shaft hole 216. Further, the protruding portion 78 is positioned between the motor wire insertion holes 214 and the application range 74. Accordingly, heat dissipating gel 9 is suppressed from dropping down into the motor wire insertion holes 214.

Further, as shown in FIG. 4, the protruding portions 76-78, as a whole, are arranged to surround the peripheries of the application range 74. As a result, the protruding portions 76-78 suppress the heat dissipating gel 9 from moving on the opposing surface 71. In particular, since the protruding portion 76 contacts the heat dissipating gel 9, the protruding portion 76 may effectively suppress movement of the heat dissipating gel 9.

In addition, if the drive device 1 is used in an electric power steering unit, vibrations from the vehicle is transmitted to the drive device 1 For this reason, the protruding portions 76-78 may suppress the heat dissipating gel 9 from falling out due to the effect of these vibrations.

Other Embodiments

Figure 6:
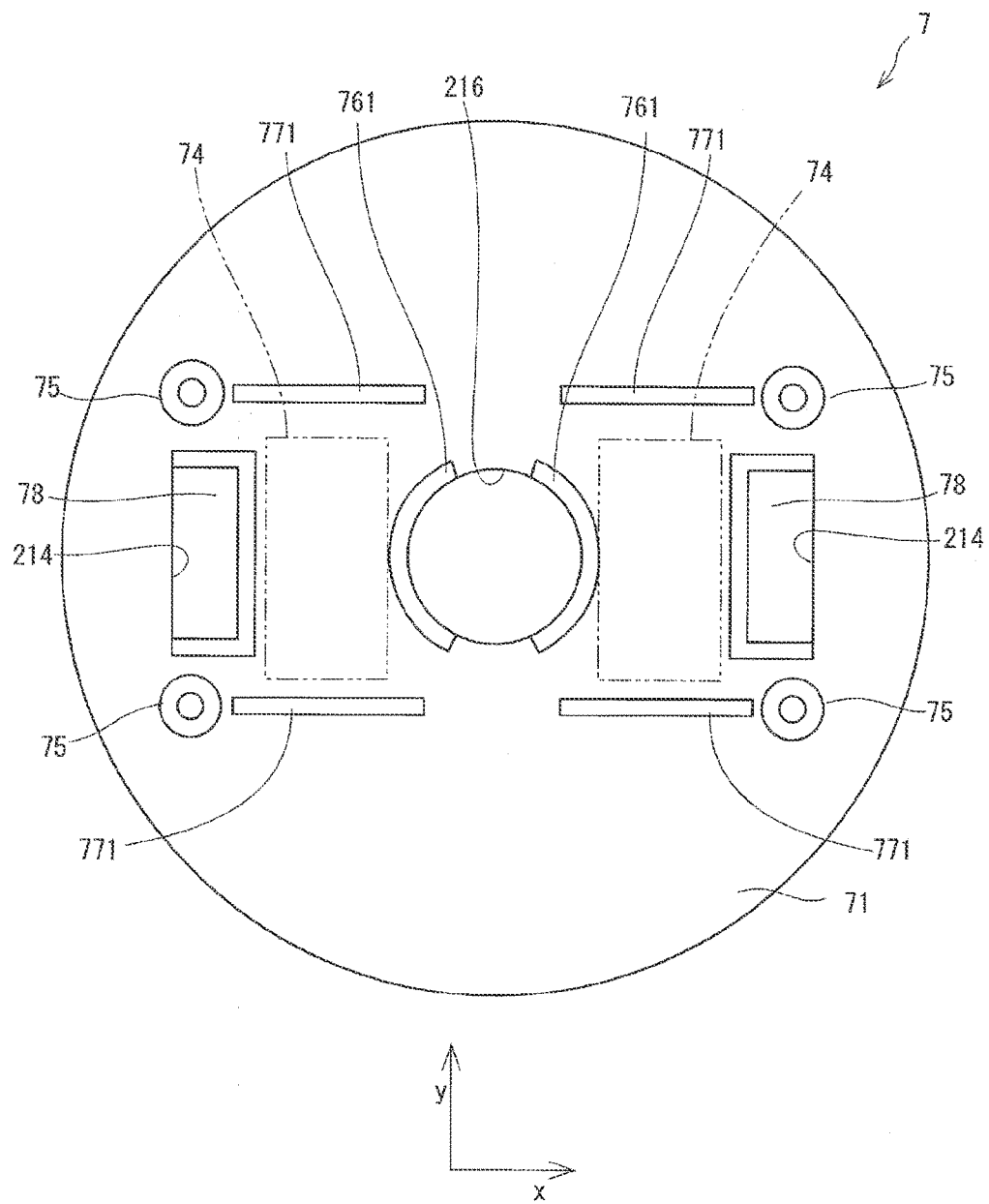
FIG. 6 is a plane view showing the heat sink for explaining examples of alternative positions for a protruding portion.

In a first modified aspect of the present embodiment, the parts of the protruding portions 76 and 77 that do not face the application range 74 may be split into a plurality of sections. For example, in this modified aspect of the present embodiment, two protruding portions 761 may be arranged along the edge of the shaft hole 216 to face the application range 74. Further, two sets of protruding portions 771 may be arranged in two straight lines, the application range 74 being interposed between the two sets of protruding portions 771 in the y direction. See FIG. 6 for reference.

In the present embodiment described above, a plurality of protruding portions 76-78 are provided on the heat sink 7. However, in a second modified aspect of the present embodiment, at least 1 of the protruding portions 76-78 may be provided. For example, as in the present embodiment, by providing at least the protruding portion 76, the electronic components 31 may be effectively prevented from contacting the heat sink 7.

In the present embodiment described above, only the protruding portion 76 is in contact with the heat dissipating gel 9. However, in a third modified aspect of the present embodiment, all of the protruding portions 76-78 may be arranged so as to contact the heat dissipating gel 9. In this case, movement of the heat dissipating gel 9 may be more effectively suppressed.

In a fourth modified aspect of the present embodiment, the wiring 59 of the substrate 5 may be provided only on the second primary surface 52. Alternatively, if problems such as disconnections or short-circuits will not occur, the wiring 59 of the substrate 5 may also be provided on the regions of the first primary surface 51 that face the protruding portions 76-78. For example, as in the present embodiment, if there is a low possibility of the protruding portions 77, 78 contacting the substrate 5, then the wiring 59 of the substrate 5 may also be provided on the regions that face the protruding portions 77, 78.

In a fifth modified aspect of the present embodiment, the ECU 3 may be not provided with any of the heat dissipating gel 9. Alternatively, instead of the heat dissipating gel 9, heat dissipating grease or the like may be provided as the heat conducting material.

In a sixth modified aspect of the present embodiment, the drive device 1 may be used in applications other than an electric power steering unit. Additionally, the electronic device of the present disclosure is not limited to the ECU 3 of the drive device 1, and may be other types of electronic devices.

The present disclosure is not limited to the embodiments described above, and includes a variety of modifications without deviating from the gist of the present disclosure.

The invention claimed is:

1. An electronic device, comprising:
   a substrate having a primary surface on which electronic components are mounted; and
   a chassis including an opposing surface, a support, and a protruding portion, wherein
   the opposing surface is arranged with a gap being defined, along a gap direction, between the primary surface of the substrate and the opposing surface,
   the support is configured to support the substrate,
   the protruding portion is arranged to protrude from the opposing surface toward a position on the primary surface of the substrate, the position being different from where the electronic components are mounted,
   the protruding portion is arranged inward, along the opposing surface, of the support, and
   in the gap direction, a height of the protruding portion is greater than a height the electronic components and shorter than the gap.

2. The electronic device of claim 1, further comprising:
   a heat conducting material that fills a space between the primary surface of the substrate and the opposing surface of the chassis so as to be in contact with the electronic components, the heat conducting material configured to conduct heat generated by the electronic components to the chassis.

3. The electronic device of claim 2, wherein
   in the gap direction, the height of the protruding portion is longer than a gap between the opposing surface of the chassis and the electronic components.

4. The electronic device of claim 2, wherein
   the protruding portion is multiply arranged such that the heat conducting material is interposed therebetween.

5. The electronic device of claim 1, wherein
   wiring is provided on a region of the primary surface of the substrate other than the position on the primary surface of the substrate that faces the protruding portion, the wiring for electrically connecting the electronic components to an external connection.

6. A drive device that rotatably drives a load, the drive device comprising:
   the electronic device of claim 1; and
   an electrical rotating machine, the electronic device controlling energizing of the electrical rotating machine.

7. The drive device of claim 6, wherein
   the electrical rotating machine includes a shaft, one end of the shaft facing the substrate,
   the chassis includes a shaft hole through which the shaft is inserted, and
   the protruding portion includes a shaft hole protruding portion, the shaft hole protruding portion being arranged along an edge of the shaft hole.

* * * * *